United States Patent [19]

Jeffries, III

[11] Patent Number: 4,797,345
[45] Date of Patent: Jan. 10, 1989

[54] LIGHT-SENSITIVE 1,2-NAPHTHOQUINONE-2-DIAZIDE-4-SULFONIC ACID MONOESTERS OF CYCLOALKYL SUBSTITUTED PHENOL AND THEIR USE IN LIGHT-SENSITIVE MIXTURES

[75] Inventor: Alfred T. Jeffries, III, Providence, R.I.

[73] Assignee: Olin Hunt Specialty Products, Inc., Palisades Park, N.J.

[21] Appl. No.: 68,397

[22] Filed: Jul. 1, 1987

[51] Int. Cl.[4] .................. G03C 1/54; G03C 1/76; C07C 113/00
[52] U.S. Cl. .................. 430/165; 430/191; 430/192; 430/193; 534/557
[58] Field of Search .................. 430/193, 192, 165; 534/557, 556

[56] References Cited

U.S. PATENT DOCUMENTS

| | | | |
|---|---|---|---|
| 2,767,092 | 10/1956 | Schmidt | 95/7 |
| 3,046,112 | 7/1962 | Schmidt et al. | 96/33 |
| 3,046,119 | 7/1962 | Sus | 430/193 |
| 3,046,121 | 7/1962 | Schmidt | 96/33 |
| 3,106,465 | 10/1963 | Neugebauer et al. | 96/33 |
| 3,130,047 | 4/1964 | Uhlig et al. | 96/33 |
| 3,188,210 | 6/1965 | Fritz et al. | 430/193 |
| 3,269,837 | 8/1966 | Sus | 96/33 |
| 3,640,992 | 2/1972 | Sus et al. | 260/141 |
| 3,823,130 | 7/1974 | Deutsch et al. | 260/141 |
| 3,900,325 | 8/1975 | Christensen et al. | 96/91 D |
| 4,551,409 | 11/1985 | Gulla et al. | 430/192 |
| 4,670,372 | 6/1987 | Lewis et al. | 430/193 |

*Primary Examiner*—Charles L. Bowers, Jr.
*Attorney, Agent, or Firm*—William A. Simons

[57] ABSTRACT

Light-sensitive 1,2-naphthoquinone-2-diazide-4-sulfonic acid monoester of a cycloalkyl-substituted phenol corresponding to the formula:

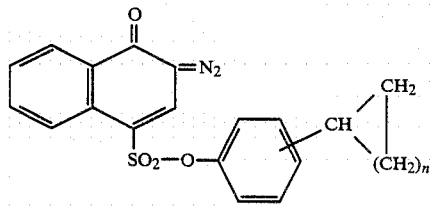

wherein n is from about 2 to about 10 and their use in light-sensitive mixtures (e.g. positive-working photoresist compositions) also containing alkali-soluble resins such as phenol-formaldehyde novolaks and cresol-formaldehyde novolaks as well as substrates coated therewith.

18 Claims, No Drawings

LIGHT-SENSITIVE 1,2-NAPHTHOQUINONE-2-DIAZIDE-4-SULFONIC ACID MONOESTERS OF CYCLOALKYL SUBSTITUTED PHENOL AND THEIR USE IN LIGHT-SENSITIVE MIXTURES

BACKGROUND OF THE INVENTION

1. Field of the Invention

This invention relates to selected light-sensitive 1,2-naphthoquinone-2-diazide-4-sulfonic acid monoester compounds. Moreover, the present invention relates to light-sensitive mixtures useful as positive-working photoresist compositions containing alkali-soluble resins together with these 1,2-naphthoquinone-2-diazide-4-sulfonic acid monoester light-sensitive compounds as well as substrates coated therewith.

2. Description of Related Art

Photoresist compositions are used in microlithography processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to fix the coating onto the substrate. The baked coated surface of the substrate is next subjected to an image-wise exposure of radiation. This radiation exposure causes a chemical transformation in the exposed areas of the coated surface. Ultraviolet (UV) light and electron beam energy are radiation sources commonly used today in microlithographic processes. After this image-wise exposure, the coated substrate is treated with a developer solution to dissolve and remove either the radiation-exposed or the unexposed areas of the coated surface of the substrate.

There are two types of photoresist compositions—negative-working and positive-working. When negative-working photoresist compositions are exposed image-wise to radiation, the areas of the resist composition exposed to the radiation become insoluble to a developer solution (e.g. a cross-linking reaction occurs) while the unexposed areas of the photoresist coating remain soluble to a developing solution. Thus, treatment of an exposed negative-working resist with the developer causes removal of the non-exposed areas of the resist coating and the creation of a negative image in the photoresist coating. On the other hand, when positive-working photoresist compositions are exposed image-wise to radiation, those areas of the resist composition exposed to the radiation become soluble to the developer solution (e.g. a decomposition reaction occurs) while those areas not exposed remain insoluble to the developer solution. Thus, treatment of an exposed positive-working resist with the developer causes removal of the exposed areas of the resist coating and the creation of a positive image in the photoresist coating.

After this development operation, the partially unprotected substrate is treated with a substrate-etchant solution or plasma gases or the like. This etchant solution or plasma gases etches the portion of the substrate where the photoresist coating was previously removed during development. The areas of the substrate where the photoresist coating still remains are protected and, thus, an etched pattern is created in the substrate material which corresponds to the image-wise exposure of the actinic radiation. Later, the remaining areas of the photoresist coating are removed during a stripping operation, leaving a clean etched substrate surface.

Positive-working photoresist compositions are currently favored over negative-working photoresists because the former generally have better resolution and pattern transfer techniques.

Photoresist resolution is the lower limit of geometrical equal line and space patterns which the resist composition can transfer from the photomask to the substrate with a high degree of image edge acuity after exposure and development. In many manufacturing applications today, resist resolution on the order of one micron or less are necessary.

In addition, it is generally desirable that the developed photoresist profile be near vertical relative to the substrate. Such demarcations between developed and undeveloped areas of the resist coating translate into accurate pattern transfer of the mask image onto the substrate after etching.

Several ingredients commonly make up positive photoresist compositions. A light stable, water-insoluble, alkali-soluble and film-forming resin (or mixture of resins) is usually the major solid component. Phenol-formaldehyde novolaks and cresol-formaldehyde novolaks and polyvinyl phenols are well known examples of such resins. One or more light-sensitive compounds (also known as photoactive compounds or sensitizers) are also present in the photoresist composition. Naphthoquinone diazide compounds are examples of such sensitizers. When a film is formed from this resin component it is soluble in an aqueous alkaline developing solution. However, addition of the sensitizer inhibits the dissolution of the film in the developing solution. When the substrate coated with the positive-working photoresist composition is subjected to an image-wise exposure of radiation, the sensitizer undergoes a radiation-induced chemical transformation in those exposed areas of the coating. This photochemical transformation eliminates the solubility-inhibiting property that the sensitizer had on the film-forming resin in alkaline developers. Accordingly, the radiation-exposed areas of the coating are now more soluble to aqueous alkaline developing solutions than the unexposed areas. This difference in solubility rates causes the exposed areas of the photoresist coating to dissolve when the coated substrate is immersed in the aqueous alkaline developing solution while the unexposed areas are largely unaffected, thus producing a positive relief pattern on the substrate.

Among the substituted naphthoquinone diazide sensitizers known are the 1,2-naphthoquinone-2-diazide-5 or 4-sulfonic acid monoesters of cyclohexanol [See U.S. Pat. No. 2,767,092 (Schmidt)], substituted benzenes [See U.S. Pat. Nos. 3,106,465 (Neugebauer); 3,130,047 (Uhlig et al) and 3,640,992 (Sus et al)] and substituted cyclohexanols [See U.S. Pat. No. 3,823,130 (Deutsch et al)].

Positive-working photoresist compositions preferably contain other ingredients besides the film-forming resin and sensitizer. For example, one or more solvents may be added. Ethyl lactate, ethylene glycol methyl ether acetate, propylene glycol methyl ether acetate, N-methyl-2-pyrrolidone, and mixtures of ethyl cellosolve acetate, butyl acetate and xylene are examples of commonly used solvents. The resin and sensitizer are dissolved in the solvent or solvents to facilitate their application to the substrate.

Other preferred photoresist additives include actinic and contrast dyes, anti-striation agents, plasticizers, speed enhancers and the like. Actinic dyes help provide increased resolution by inhibiting back scattering of light off the substrate. This back scattering causes the undesirable effect of optical notching, especially where the substrate surface is highly reflective or has topography. Contrast dyes enhance the visibility of developed images and facilitate pattern alignment during manufacturing. Anti-striation agents level out the photoresist coating or film to a uniform thickness. This is important to ensure uniform radiation exposure over the film surface. Plasticizers improve the coating and adhesion properties of the photoresist composition and better allow for the application of a thin coating or film of photoresist which is smooth and of uniform thickness onto the substrate. Speed enhancers tend to increase the solubility of the photoresist coating in both the exposed and unexposed areas, and thus, they are used in applications where speed of development is the overriding consideration even though some degree of contrast may be sacrificed, i.e. while the exposed areas of the photoresist coating will be dissolved more quickly by the developer, the speed enhancers will also cause a larger loss of photoresist coating from the unexposed areas.

In all, while numerous types of sensitizers have been employed in making positive-working photoresists, there is still a need to find new ones which may be better with specific film-forming resins or with specific solvents or additives for specific processing applications. The present invention is thus directed to a new class of light-sensitive compounds which may have advantages in such situations.

SUMMARY OF THE INVENTION

Accordingly, the present invention is directed to, as novel compositions of matter, the 1,2-naphthoquinone-2-diazide-4-sulfonic acid monoester of a cycloalkyl-substituted phenols corresponding to the formula (I):

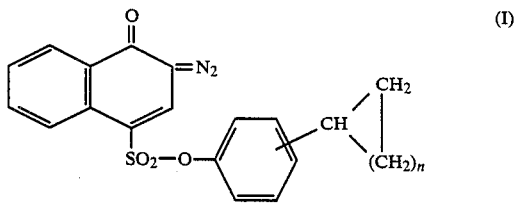

wherein n is from about 2 to about 10.

Moreover, the present invention also encompasses light-sensitive mixtures useful as positive-working photoresist compositions comprising:

(a) at least one alkali-soluble resin; and
(b) at least one of the above-noted monoester compounds of formula (I).

Still further, the present invention encompasses substrates coated with these light-sensitive mixtures.

DETAILED DESCRIPTION OF THE PREFERRED EMBODIMENTS

The ester compounds of the present invention may be made by reacting a 1,2-naphthoquinone-2-diazide-4-sulfonic acid halide with the corresponding cycloalkyl-substituted phenol. This reaction is illustrated by the following reaction equation (A) wherein 1,2-naphthoquinone-2-diazide-4-sulfonic acid chloride and 4-cyclohexyl phenol are the precursors:

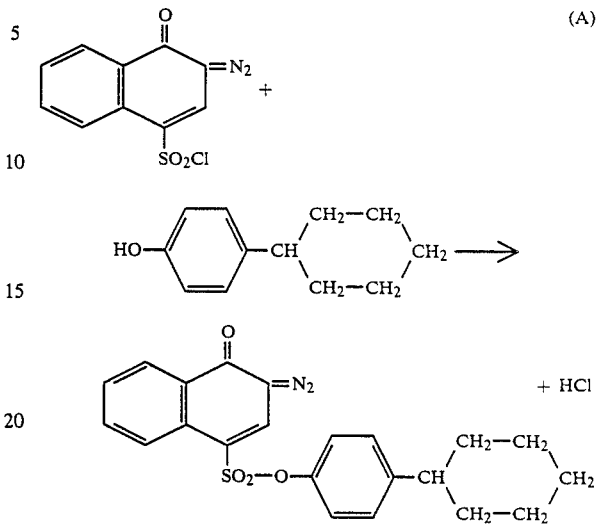

These ester compounds of formula (I), above are preferably prepared by first dissolving the sulfonic acid halide precursor, preferably the sulfonic acid chloride, in a suitable solvent. Suitable solvents include acetone, dioxane, 2-butanone, or cyclohexanone and the like. The cycloalkyl-substituted phenol precursor is then added to this solution. It is advantageous to carry out this reaction in the presence of an acid-scavenging base, such as alkali metal carbonates or bicarbonates, alkaline earth metal carbonates or bicarbonates, tertiary aliphatic amines or pyridine.

The esterification products of this reaction may be recovered from the reaction mixture by any conventional means, preferably by extraction with methylene chloride or other water-immiscible extraction solvents followed by drying.

At least one of the ester compounds of the present invention may be mixed with an alkali-soluble resin or resins to make light-sensitive mixtures which are useful as positive-working photoresist compositions. The term "alkali-soluble resin" is used herein to mean a resin which will dissolve completely in an aqueous alkaline developing solution conventionally used with positive-working photoresist compositions. Suitable alkali-soluble resins include phenol-formaldehyde novolak resins, cresol-formaldehyde novolak resins, and polyvinyl phenol resins, preferably having a molecular weight of about 500 to about 30,000, and more preferably from about 1,000 to 20,000. These novolak resins are preferably prepared by the condensation reaction of phenol or cresol with formaldehyde and are characterized by being light-stable, water-insoluble, alkali-soluble and film-forming. The most preferred class of novolak resins is formed by the condensation reaction between a mixture of meta- and para-cresols with formaldehyde having a molecular weight of about 500 to about 5,000. The preparation of examples of such suitable resins is disclosed in U.S. Pat. Nos. 4,377,631; 4,529,682; and 4,587,196, all which issued to Medhat Toukhy and are incorporated herein by reference in their entireties.

The proportion of the above ester compound of formula (I) in the light-sensitive mixture may preferably range from about 5 to about 50 percent, more preferably from about 8 to about 30 percent by weight of the non-volatile (i.e. non-solvent) content of the light-sensitive mixture. The proportion of alkali-soluble resin in the light-sensitive mixture may preferably range from about 50 to about 95 percent, more preferably, from about 70 to 92 percent of the non-volatile (i.e. non-solvent) content of the light-sensitive mixture.

These light-sensitive mixtures may also contain conventional photoresist composition ingredients such as solvents, dyes, anti-striation agents, plasticizers, speed enhancers, non-ionic surfactants and the like. These additional ingredients may be added to the novolak resin and sensitizer solution before the solution is coated onto the substrate.

Examples of suitable solvents include ethyl cellosolve acetate, butyl acetate, xylene, ethyl lactate, propylene glycol alkyl ether acetates, mixtures thereof and the like. The preferred amount of solvent may be from about 50% to about 500% by weight, more preferably, from about 100% to about 300%, based on combined resin and sensitizer.

Examples of actinic dyes include those that absorb light energy at approximately 400–460 nm [e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g. 2,5-diphenyloxazole (PPO-Chem. Abs. Reg. No. 92-71-7) and 2-(4-biphenyl)-6-phenyl-benzoxazole (PBBO-Chem. Abs. Reg. No. 17064-47-0)].

Examples of contrast dye additives that may be used together with the light-sensitive mixtures of the present invention include Solvent Red 24 (C.I. No. 26105), Basic Fuchsin (C.I. 42514), Oil Blue N (C.I. No. 61555) and Calco Red A (C.I. No. 26125) at up to ten percent weight levels, based on the combined weight of resin and sensitizer.

Anti-striation agents may be used up to five percent weight level, based on the combined weight of resin and sensitizer. One suitable class of anti-striation agents is a non-ionic silicon-modified polymer. Non-ionic surfactants may also be used for this purpose including for example, nonylphenoxy poly(ethyleneoxy) ethanol; octylphenoxy (ethyleneoxy) ethanol; and dinonyl phenoxy poly(ethyleneoxy) ethanol.

Plasticizers which may be used include, for example, phosphoric acid tri-($\beta$-chloroethyl)-ester; stearic acid; dicamphor; polypropylene; acetal resins; phenoxy resins; and alkyl resins at up to ten percent weight levels, based on the combined weight of resin and sensitizer.

Speed enhancers that may be used include, for example, picric acid, nicotinic acid or nitrocinnamic acid at a weight level of up to 20 percent, based on the combined weight of resin and sensitizer.

The prepared light-sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters.

After the resist composition solution is coated onto the substrate, the substrate is baked at approximately 80° to 105° C. until substantially all the solvent has evaporated and only a thin uniform coating or film of photoresist composition on the order of a micron in thickness remains on the substrate. The coated substrate can then be exposed to radiation, especially ultraviolet radiation, in any desired exposure pattern, produced by use of suitable masks, negatives, stencils, templates, and the like.

The exposed resist-coated substrates are next substantially immersed in alkaline developing solution. The solution is preferably agitated, for example, by nitrogen gas agitation. Alternative development techniques such as spray development or puddle development or combinations thereof may also be used.

The substrates are allowed to remain in the developer until all of the resist coating has dissolved from the exposed areas. Normally, development times from about 30 seconds to about 3 minutes are employed. Suitable examples of alkaline developers are aqueous solutions of sodium hydroxide, potassium hydroxide, tetramethyl ammonium hydroxide, choline, sodium phosphates, sodium carbonate, sodium metasilicate and the like.

After removal of the coated wafers from the developing solution they are preferably subjected to a deionized water rinse, more preferably agitated with nitrogen followed by blow drying with filtered air. A post-development heat treatment or bake is employed to increase the coating's adhesion and chemical resistance to etching solutions and other substances. The post-development heat treatment can comprise the oven baking of the coating and substrate below the coating's softening point.

In industrial applications, particularly in the manufacture of microcircuitry units on silicon/silicon dioxide-type substrates, the developed substrates may then be treated with a buffered, hydrofluoric acid etching solution or plasma gas etch. The resist compositions of the present invention are resistant to acid etching solutions or plasma gases and provide effective protection for the unexposed resist-coating areas of the substrate.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE I

Synthesis of 1,2-Naphthoquinone-2-diazide-4-Sulfonic Acid Monoester of 4-Cyclohexylphenol To a reaction flask is added 33.36 g 4-oxo-3,4-dihydro-3-diazo-1-naphthalene sulfonyl chloride (also known as 1,2-naphthoquinone-2-diazide-4-sulfonic acid chloride), 21.88 g 4-cyclohexylphenol, and 300 mL p-dioxane. Agitation was started and after the solids had dissolved, 13.17 g sodium carbonate in 199 mL distilled water was added over 20 minutes. The mixture was allowed to stir 16 hours at ambient temperature.

The reaction mixture was poured into 1200 mL distilled water and 25 mL 12N HCl. Yellow solid crystals were formed upon rubbing the precipitated product against the beaker surface with a glass rod. Approximately 800 mL methylene chloride was added in the reaction mixture. This dissolved the solid crystals. This resulting mixture was placed in a separatory funnel and washed twice with 2% sodium carbonate aqueous solution, twice with 300 mL distilled water, twice with saturated sodium chloride solution and dried over anhydrous magnesium sulfate and filtered.

Evaporation left a yellow solid which was dried in vacuum under a stream of air to yield 38.4 g of a yellow solid; 76% of the theoretical amount of product to be obtained.

The product was confirmed to be the above titled structure by IR, proton NMR and UV analysis.

EXAMPLE II

Synthesis of 1,2-Naphthoquinone-2-diazide-4-Sulfonic Acid Monoester of 4-Cyclopentylphenol To a vessel is added 11.8 g 4-oxo-3,4-dihydro-3-diazonaphthalene-1-sulfonyl chloride (also known as 1,2-naphthoquinone-2-diazide-4-sulfonic acid chloride), 7.5 g 4-cyclopentylphenol, and 125 mL p-dioxane. To the solution was added 47 mL 10% aqueous sodium carbonate over 15 minutes.

The reaction mixture was allowed to stir at ambient temperature for 16 hours.

The mixture was poured into 800 mL water, and it was extracted with 500 mL methylene chloride. This solution was washed once with 50 mL 10% sodium carbonate solution, was washed twice with water, was washed twice with brine solution, was dried over magnesium sulfate and was filtered.

The solution was concentrated under reduced pressure, was triturated under cyclohexane and was dried under high vacuum to leave 13.5 g product, 78% of the theoretical yield.

The product was confirmed to be the above titled structure by IR, proton NMR and UV analysis.

EXAMPLE III

Preparation of a Photoresist Composition With the Sensitizer of Example I 3.15 g Of the sensitizer produced in Example I was mixed with about 1 g Celite filter aid and a solution composed of 33.48 g mixed 80% m- and 20% p-cresol-formaldehyde novolak resin and 88.27 g of a solvent composed of 85% ethyl cellosolve acetate, 10% butyl acetate and 5% xylene and 31 mg of a non-ionic silicon-modified polymer anti-striation agent in a 6 oz. amber bottle. The bottle was then rolled on a high speed roller for approximately 12 hours at room temperature until all solids were dissolved. The resulting resist solution was subsequently filtered through a 0.2 micron pore-size filter using a Millipore microfiltration system (a 100 mL barrel and a 47 m disk were used). The filtration was conducted in a nitrogen environment under a pressure of 10 pounds per square inch. Approximately 110 g of filtered resist solution was obtained.

EXAMPLE IV

Preparation of a Photoresist Composition With the Sensitizer of Example II

In a similar manner as described in Example III, 3.15 g sensitizer from Example II was mixed with the same mixed cresol-formaldehyde novolak, solvent mixture and anti-striation agent. The resulting solids mixture was dissolved and filtered as in Example III.

EXAMPLE V

Coating of Photoresist Compositions onto a Substrate

Approximately one gram of the filtered resist compositions of Examples III and IV were each spin-coated with a spinner manufactured by Headway Research Inc. (Garland, Texas) onto a thermally grown silicon/silicon dioxide-coated wafer of three inches in diameter and having 5,000 Angstroms of silicon oxide on its surface. A resist coating was applied at a spinning velocity of 5,000 revolutions per minute for 30 seconds. The two coated wafers were subsequently baked in an air-circulating oven at 100° C. to 105° C. for 30 minutes and the film thickness was then measured to be approximately one micron with a Sloan Dektak IIa surface profilometer unit.

EXAMPLE VI

Image-Wise Exposure of Coated Substrates

The two coated wafers of Example V were image-wise exposed to mid-UV light wavelengths between 300–340 nm using a Canon Parallel Light Aligner (Model PLA 501 F) in a contact mode together with a 290 nm cold mirror. The mid-UV light wavelengths were passed through a quartz OPTOLINE photoresist step tablet for approximately 15 seconds to provide areas of various exposure energies on the coated surface of the wafers. At the full transmittance, 9 milliwatts per centimeter surface energy at 310 nm wavelength was measured.

EXAMPLE VII

Development of Exposed Resist-Coated Substrates

The two resist-coated wafers exposed according to Example VI were then placed on circular Teflon wafer boats and immersed in a two-liter Teflon container containing Waycoat Positive LSI Developer Solution, Type I (Olin Hunt Specialtiy Products Inc.) an aqueous alkaline buffered solution, with a pH of about 12.5. Nitrogen-gas agitation was provided in the Teflon container to aid and accelerate development. The wafers were allowed to remain immersed in the developer solution for one minute. Upon removal, the wafers were rinsed in deionized water for one minute and dried in a stream of filtered air.

The developed and exposed wafers were examined to determine photospeed and contrast of the photoresist coatings of Examples III and IV.

Photospeed of each resist was determined by looking at each of the developed areas of the resist coating corresponding to different % transmittance windows of OPTOLINE tablet. Photospeed of each resist was calculated by multiplying the exposure energy at full transmittance times, the lowest % transmittance window of the tablet at which resist coating was completely developed (i.e. all of soluble coating was removed). The calculated photospeeds are given in the Table below.

Contrast was determined by plotting the logarithm of the dose of exposure energy against the normalized film thickness remaining after development at each % transmittance window. This plot of points generated a contrast curve from which a straight line was obtained by extrapolation of the near vertical portion of the curve. The slope of this straight line was the contrast value of the resist. The determined values for each resist are given in the Table below.

TABLE I

| Photospeed Contrast Values for Resist Compositions in Examples III and IV | | |
|---|---|---|
| Composition | Photospeed | Contrast |
| Example III | 30.1 | 2.59 |
| Example IV | 29.0 | 2.57 |

The data indicates that compositions containing cycloaliphatic phenyl ester moieties of 1,2-naphthoquinone-2-diazide-4-sulfonic acid have photospeed and contrast values which are very similar to corresponding values of commercial photoresist compositions and, thus, also appear suitable for commercial applications.

What is claimed is:

1. A light-sensitive 1,2-naphthoquinone-2-diazide-4-sulfonic acid monoester of a cycloalkyl-substituted phenol corresponding to the formula:

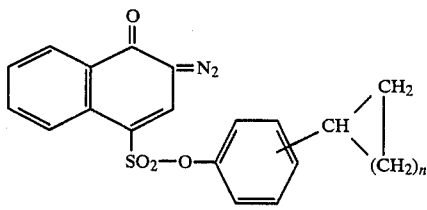

wherein n is from about 2 to about 10.

2. The monoester compound of claim 1 wherein said n is from about 3 to about 6.

3. The monoester compound of claim 1 wherein said n=3.

4. The monoester compound of claim 1 wherein said n=4.

5. A light-sensitive mixture useful as a positive-working photoresist composition comprising in admixture:
   (a) from about 50 to about 95 percent of at least one alkali-soluble resin; and
   (b) from about 50 to about 5 percent of a light-sensitive 1,2-naphthoquinone-2-diazide-4-sulfonic acid monoester of a cycloalkyl-substituted phenol corresponding to the formula:

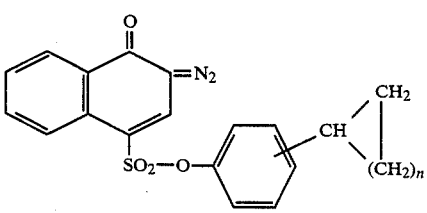

wherein n is from about 2 to about 10, said percentages of (a) and (b) are based on the non-volatile content of said mixture.

6. The light-sensitive mixture of claim 5 wherein n is from about 3 to about 6.

7. The light-sensitive mixture of claim 5 wherein n=3.

8. The light-sensitive mixture of claim 5 wherein n=4.

9. The light-sensitive mixture of claim 5 wherein said alkali-soluble resin is a novolak resin selected from the group consisting of phenol-formaldehyde novolak resins and cresol-formaldehyde resins.

10. The light-sensitive mixture of claim 5 further comprising one or more additives selected from the group consisting of solvents, actinic and contrast dyes, anti-striation agents, plasticizers and speed enhancers.

11. A coated substrate comprising a substrate material coated with a film of a light-sensitive mixture comprising in admixture:
   (a) from about 50 to about 95 percent of at least one alkali-soluble resin; and
   (b) from about 50 to 5 percent of a light-sensitive 1,2-naphthoquinone-2-diazide-4-sulfonic acid monoester of a cycloalkyl-substituted phenol corresponding to the formula:

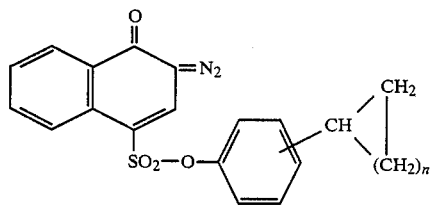

wherein n is from about 2 to about 10, wherein said percentages of (a) and (b) are based on the non-volatile content of said mixture.

12. The coated substrate of claim 11 wherein said substrate comprises one or more compounds selected from the group consisting of polyester, polyolefin, silicon, gallium arsenide, silicon/cilicon dioxide, doped silicon dioxide, silicon nitride, aluminum/copper mixtures, tantalum, copper and polysilicon.

13. The coated substrate of claim 11 wherein said substrate is a silicon wafer coated with silicon dioxide.

14. The coated susbstrate of claim 11 wherein said n is from about 3 to about 6.

15. The coated substrate of claim 11 wherein said n=3.

16. The coated substrate of claim 11 wherein said n=4.

17. The coated substrate of claim 11 wherein said alkali-soluble resin is a novolak resin selected from the group consisting of phenol-formaldehyde novolak resins and cresol-formaldehyde resins.

18. The coated substrate of claim 11 further comprising one or more additives selected from the group consisting of solvents, actinic and contrast dyes, anti-striation agents, plasticizers and speed enhancers.

* * * * *